United States Patent
Park et al.

(10) Patent No.: US 8,263,455 B2
(45) Date of Patent: Sep. 11, 2012

(54) METHOD OF FORMING VARIABLE RESISTANCE MEMORY DEVICE

(75) Inventors: Young-Lim Park, Hwaseong-si (KR); Jinil Lee, Seongnam-si (KR); Dongho Ahn, Hwaseong-si (KR); Sihyung Lee, Suwon-si (KR); Gyuhwan Oh, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 12/953,945

(22) Filed: Nov. 24, 2010

(65) Prior Publication Data

US 2011/0124174 A1    May 26, 2011

(30) Foreign Application Priority Data

Nov. 25, 2009    (KR) .................. 10-2009-0114687

(51) Int. Cl.
*H01L 21/283* (2006.01)

(52) U.S. Cl. ............................... 438/238; 257/E21.159

(58) Field of Classification Search ........... 257/E21.159; 438/238, 384, 385
See application file for complete search history.

(56) References Cited

U.S. PATENT DOCUMENTS

| 2004/0219784 A1* | 11/2004 | Kang et al. ............. 438/653 |
| 2006/0172083 A1* | 8/2006 | Lee et al. ............. 427/535 |
| 2007/0246743 A1 | 10/2007 | Cho et al. |
| 2008/0006811 A1* | 1/2008 | Philipp et al. ............. 257/4 |
| 2008/0210924 A1 | 9/2008 | Shin |
| 2008/0283812 A1 | 11/2008 | Liu |
| 2009/0233421 A1* | 9/2009 | Lee et al. ............. 438/478 |
| 2009/0275198 A1* | 11/2009 | Kamepalli et al. ............. 438/659 |

FOREIGN PATENT DOCUMENTS

| JP | 2007-294964 | 11/2007 |
| JP | 2008-182227 | 8/2008 |
| KR | 10-0717286 | 5/2007 |
| KR | 10-2008-0069473 | 7/2008 |

* cited by examiner

*Primary Examiner* — Julio J Maldonado
*Assistant Examiner* — Daniel Shook
(74) *Attorney, Agent, or Firm* — Harness, Dickey & Pierce, P.L.C.

(57) ABSTRACT

Provided are a method of forming an electrode of a variable resistance memory device and a variable resistance semiconductor memory device using the method. The method includes: forming a heat electrode; forming a variable resistance material layer on the heat electrode; and forming a top electrode on the variable resistance material layer, wherein the heat electrode includes a nitride of a metal whose atomic radius is greater than that of titanium (Ti) and is formed through a thermal chemical vapor deposition (CVD) method without using plasma.

21 Claims, 8 Drawing Sheets

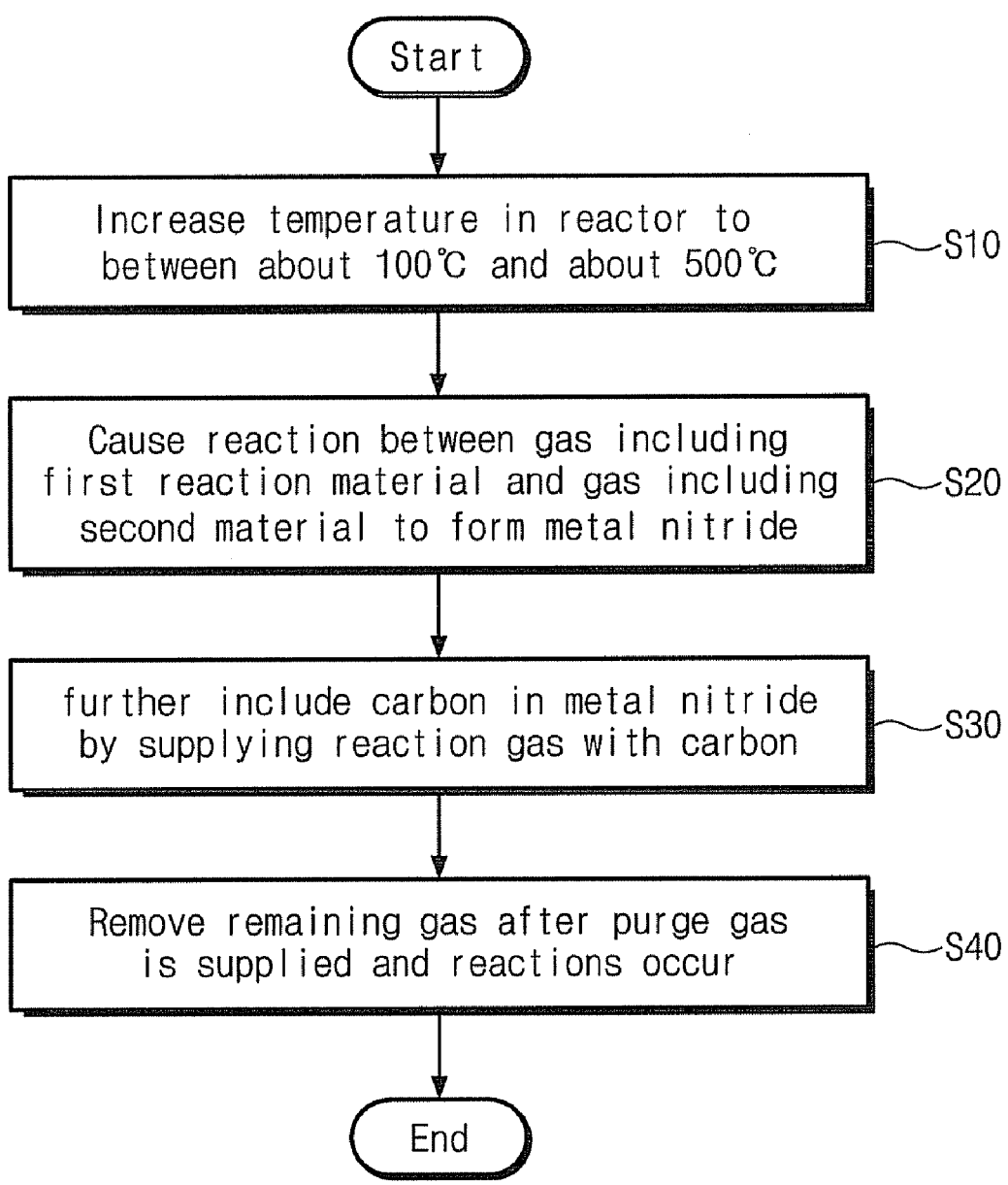

METHOD OF FORMING VARIABLE RESISTANCE MEMORY DEVICE

CROSS-REFERENCE TO RELATED APPLICATIONS

This U.S. non-provisional patent application claims priority under 35 U.S.C. §119 to Korean Patent Application No. 10-2009-0114687, filed on Nov. 25, 2009, in the Korean Intellectual Property Office (KIPO), the entire contents of which are herein incorporated by reference.

BACKGROUND

1. Field

Example embodiments relate to a method of forming an electrode of a variable resistance memory device and a variable resistance semiconductor memory device using the electrode.

2. Description of the Related Art

Semiconductor memory devices may be classified into volatile memory devices and nonvolatile memory devices. The nonvolatile memory devices retain their stored data even when power to the nonvolatile memory devices is cut off. Examples of nonvolatile memory devices may include a Programmable ROM (PROM), an Erasable PROM (EPROM), an Electrically EPROM (EEPROM), and a Flash Memory Device. A demand for nonvolatile memory devices that are capable of repeatedly performing read and write operations has been increased.

With regard to nonvolatile memory devices, variable resistance memory devices, for example, a Resistive Random Access Memory (ReRAM) and a Phase-change Random Access Memory (PRAM), are being developed currently. Materials constituting these variable resistance memory devices have variable resistance values according to current or voltage and maintain their resistance values even when current or voltage supply is cut off.

PRAM uses a phase change material, for example, a chalcogenide. The phase change material has a crystalline state and an amorphous state according to temperature variation. When a phase change material layer of an amorphous state is heated for a predetermined time at a temperature between a crystallization temperature and a melting point temperature and then is cooled, it changes from the amorphous state into a crystalline state (set programming). On the contrary, when the phase change material layer is heated at a higher temperature than the melting point temperature and then cooled drastically, it changes from a crystalline state into an amorphous state (reset programming).

SUMMARY

Example embodiments provide a variable resistance semiconductor memory device and a method of forming the same.

Example embodiments provide methods of forming a variable resistance memory device, the methods may include forming a heat electrode, forming a variable resistance material layer on the heat electrode, and forming a top electrode on the variable resistance material layer. In example embodiments, the heat electrode may include a nitride of a metal whose atomic radius is greater than that of titanium (Ti) and may be formed through a thermal chemical vapor deposition (CVD) method without using plasma.

In accordance with example embodiments, a method of forming a variable resistance memory device may include forming a heat electrode, forming a variable resistance material layer on the heat electrode, and forming a top electrode on the variable resistance material layer. In example embodiments, the heat electrode may include a nitride of a metal whose atomic radius is greater than that of titanium (Ti) and is formed through a thermal chemical vapor deposition (CVD) method without using plasma.

In accordance with example embodiments, a variable resistance memory device may include a heat electrode, a variable resistance material layer on the heat electrode, and a top electrode on the variable resistance material layer. In example embodiments, the heat electrode may include a nitride of a metal whose atomic radius is greater than that of titanium (Ti) and has a resistivity of more than about 5000 $\mu\Omega\cdot$cm.

In example embodiments, the metal of the heat electrode may have an ionic radius between about 68 pm and about 108 pm. The nitride of the metal may be selected from the group consisting of tantalum (Ta), zirconium (Zr), dysprosium (Dy), and niobium (Nb). The nitride of the metal may further include carbon (C). The nitride of the metal may include a tantalum carbon nitride (TaCN). The heat electrode may have resistivity of more than about 5000 $\mu\Omega\cdot$cm. The thermal CVD method may be implemented using a first reaction gas and a second gas, the first reaction gas may include tantalum halide derivatives or tantalum amine derivatives, the second gas may include a material selected from the group consisting of $H_2$, $NH_3$, $SiH_4$, and $Si_2H_6$. The thermal CVD method may implement reaction of the first reaction gas and the second gas at a temperature range of about 100° C. to about 550° C. The variable resistance material layer may include a chalcogenide based phase change material. The methods further may include performing a thermal treatment operation or a plasma treatment operation, with hydrogen or halogen element, on the variable resistance material layer.

In example embodiments, variable resistance memory devices may include a heat electrode, a variable resistance material layer on the heat electrode, and a top electrode on the variable resistance material layer. In example embodiments, the heat electrode may include a nitride of a metal whose atomic radius is greater than that of titanium (Ti) and has resistivity of more than about 5000 $\mu\Omega\cdot$cm.

In example embodiments, the variable resistance material layer may store a resistance state of more than 2 bits with respect to a unit cell. The variable resistance material layer may include more than two phase change material layers having respectively different resistance values in an amorphous state. The respectively different more than two phase change material layers may have respectively different volumes. One phase change material layer of the respectively different more than two phase change material layers may contact the heat electrode and the one phase change material layer contacting the heat electrode may have a less resistance value in an amorphous state than other phase change material layers in the variable resistance material layer.

BRIEF DESCRIPTION OF THE DRAWINGS

The accompanying drawings are included to provide a further understanding of example embodiments, and are incorporated in and constitute a part of this specification. The drawings illustrate example embodiments and, together with the description, serve to explain principles of example embodiments. In the drawings:

FIG. 4 is a flowchart illustrating a method of forming a metal nitride layer according to example embodiments;

DETAILED DESCRIPTION OF EXAMPLE EMBODIMENTS

Figure 1:
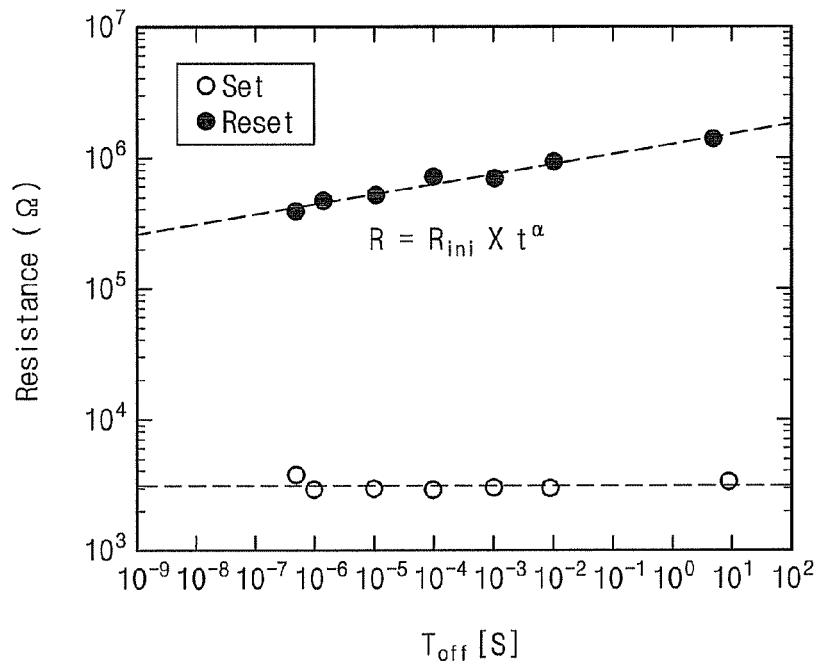
FIG. 1 is a graph illustrating resistance drift of a chalcogen amorphous material.

The objects, other objectives, features, and advantages of example embodiments will be understood without difficulties by referring to the accompanying drawings. Example embodiments may, however, be embodied in different forms and should not be construed as limited to example embodiments set forth herein. Rather, example embodiments are provided so that this disclosure will be thorough and complete, and will fully convey the scope of the inventive concept to those skilled in the art.

In this specification, it will also be understood that when another component is referred to as being 'on' one component, it can be directly on the one component, or an intervening third component may also be present. Also, in the figures, the dimensions of layers and regions are exaggerated for clarity of illustration.

Additionally, example embodiments will be described with sectional views and/or plan views as ideal exemplary views. In the figures, the dimensions of layers and regions are exaggerated for clarity of illustration. Accordingly, shapes of the exemplary views may be modified according to manufacturing techniques and/or allowable errors. Therefore, example embodiments are not limited to the specific shape illustrated in the exemplary views, but may include other shapes that may be created according to manufacturing processes. For example, an etched region illustrated as a rectangle may have rounded or curved features. Areas exemplified in the drawings have general properties, and are used to illustrate a specific shape of a semiconductor package region. Thus, this should not be construed as limited to the scope of example embodiments. Also, though terms like a first, a second, and a third are used to describe various regions and layers in various example embodiments, the regions and the layers are not limited to these terms. These terms are only used to distinguish one component from another component. Example embodiments described and exemplified herein include a complementary embodiment thereof.

In the following description, the technical terms may be used only for explaining example embodiments and should not be used to limit the invention. The terms of a singular form may include plural forms unless specifically mentioned. The meaning of 'comprises' and/or 'comprising' does not exclude other components besides a mentioned component.

Figure 2:
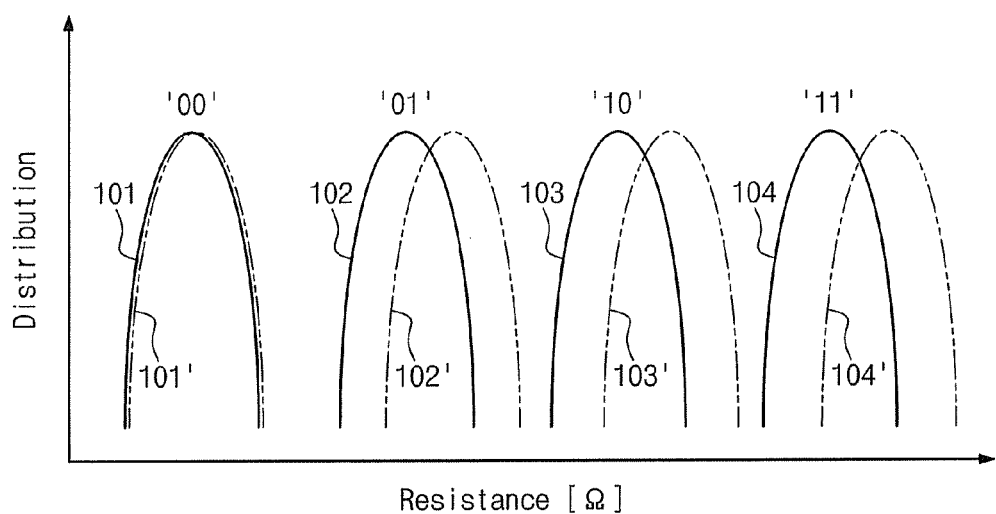
FIG. 2 is a graph illustrating a distribution change of data states in a multi-level phase change memory device.

Referring to FIGS. 1 and 2, resistance drift of a variable resistance memory device, for example, a phase change memory device, is described below.

Resistance of a phase change material with an amorphous state may be increase as time passes due to various factors. The resistance drift with an amorphous state may be greater when a resistance value of the phase change material is relatively high. Referring to FIG. 1, the resistance drift may be expressed as Equation $R=R_{ini} \times t^{\alpha}$. $R_{ini}$ is an initial resistance value when being programmed in an amorphous state (i.e., a RESET state). $\alpha$ is called a variation index. $T_{off}$ is a time after being changed into an amorphous state and current is turned off.

The phase change layer may change into a plurality of states having respectively different resistivities. In order to increase a memory capacity, a multi-level technique may be applied to a phase change memory device. In the multi-level technique, a phase change layer may have states of more than 2 bits. Hereinafter, this memory device is called a multi-level phase change memory device. In example embodiments, 2-bit data may be stored in one memory cell. For example, as illustrated in FIG. 2, 2-bit data may have one of possible four states such as 00, 01, 10, and 11. Distribution 101 corresponding to a state 00 includes memory cells having a crystalline state. Distributions 102, 103, and 104 corresponding to remaining states 01, 10, and 11 include memory cells having an amorphous state. Resistance values of memory cells in the distribution 102 corresponding to the state 01 may be less than those of memory cells in the distribution 103 corresponding to the state 10. Resistance values of memory cells in the distribution 103 corresponding to the state 10 may be less than those of memory cells in the distribution 104 corresponding to the state 11.

The distributions 101, 102, 103, and 104 indicated with a solid line are distribution curves after memory cells are programmed by partially converting a chalcogen material into an amorphous one. Due to the resistance drift, the programmed distributions 101, 102, 103, and 104 may drift. Distributions 101', 102', 103', and 104' indicated with a dotted line are distribution curves due to the resistance drift after time has passed after programming. Due to the resistance drift, data of the phase change memory device may be unstable such that read error may occur.

Figure 3A:
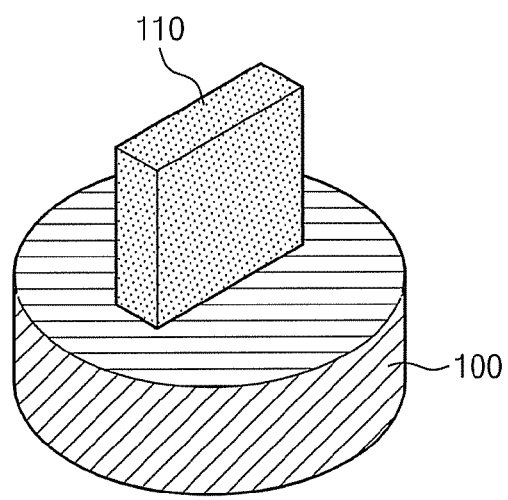
FIGS. 3A through 3C are views illustrating a method of forming a variable resistance memory device according to example embodiments.
Figure 3B:
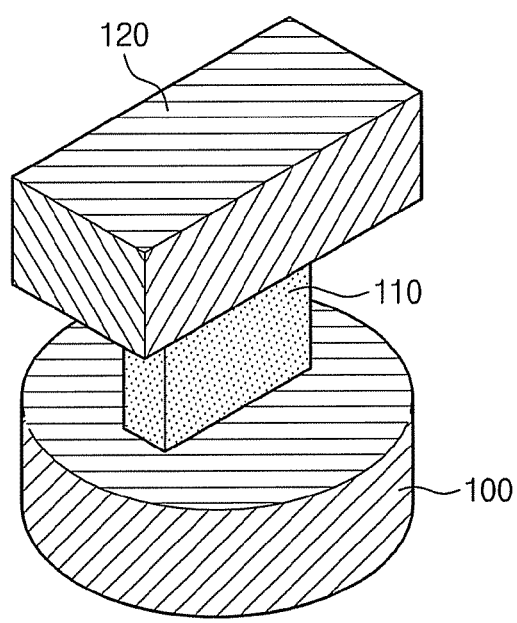
Figure 3C:
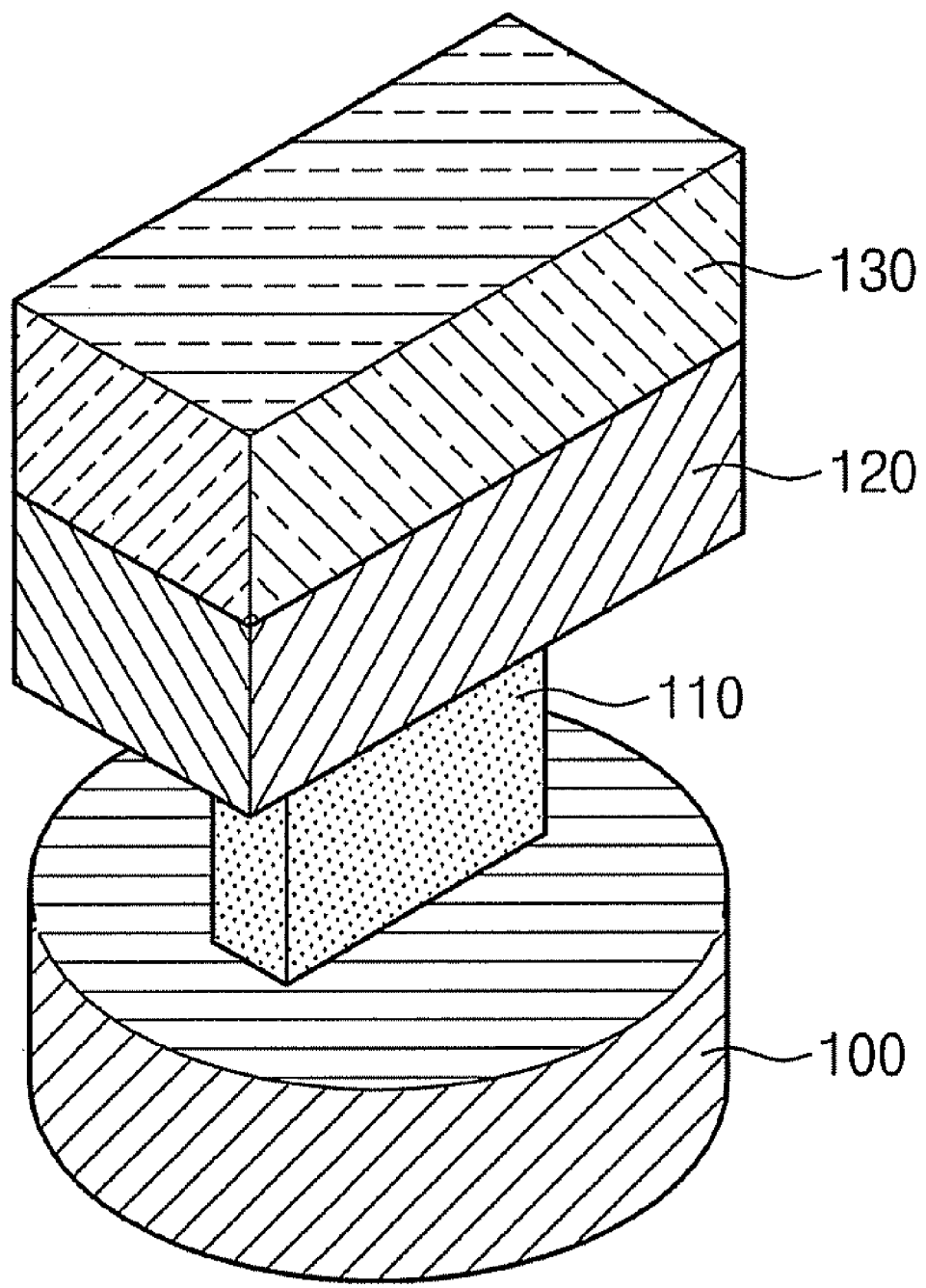

FIGS. 3A to 3C are views illustrating a method of forming a variable resistance memory device according to example embodiments.

Referring to FIG. 3A, a heat electrode 110 may be formed on a prepared semiconductor substrate 100. The semiconductor substrate 100 may include a conductive pattern and/or a switching device (for example, a transistor or a diode). For example, the heat electrode 110 may be formed on a semiconductor pn diode. Although not illustrated in the drawings, an ohmic layer, for example, a silicide layer, may be formed between the heat electrode 110 and the pn diode.

The heat electrode 110 may be formed to have resistivity for heating a variable resistance material layer 120, which will be formed during a following process. The resistivity of the heat electrode 110 may be more than about 5000 μΩ·cm. The heat electrode 110 of example embodiments serves as a conductor of a typical semiconductor device and also serves to heat a variable resistance material layer disposed thereon, such that a higher electrical resistance value than a typical metal conductor is required. However, if the resistivity of the heat electrode 110 is more than about 100000 μΩ·cm, in order to provide an operating current necessary for programming, a higher voltage than a typical voltage may be required. Accordingly, the resistivity of the heat electrode 110 may be less than about 100000 μΩ·cm in a device that requires a low voltage operation.

The heat electrode 110 may be formed of a nitride of a metal whose atomic radius is greater than that of Ti, for example, a nitride of a metal whose atomic radius is between about 65 pm and about 108 pm. Non-limiting examples of metallic elements that satisfy the above condition include Ta, Zr, Dy, Nb, and V. In order to improve heating characteristics, the metal nitride may further include carbon.

In a case of tantalum, its ionic radius may be about 78 pm and thus may be greater than an ionic radius (about 60 pm) of titanium of TiN, which may be used for a heat electrode of a phase change memory device. Thus, if an ionic radius of a metal ion is relatively large, the outermost electron may be lost due to shielding effect and bonds may be easily formed at an interface between a phase change material layer and a heat electrode, such that the interface may become relatively stable.

In addition, in a case of TiN, a coefficient of thermal expansion may be about $8.2 \times 10^{-6}$ mm/° C. If TiN is applied to a heat electrode, compressive stress of a phase change material (for example, GST) on the top of the heat electrode may be increased and thereby, energy band gap (Eg) may be increased such that resistance increasing phenomenon may occur. Accordingly, when data is stored by changing a phase change material from a crystalline state into an amorphous state in a phase change memory device, resistance drift may occur, in which a resistance value may be increased as time passes. According to example embodiments, when TaCN is applied to a heat electrode, compressive stress may be reduced because a coefficient of thermal expansion is relatively small (about $3.6 \times 10^{-6}$ min/° C.) and thereby, resistance drift may be also reduced.

In comparison to a case that a resistance drift coefficient d is about 0.08 when a TiN electrode is used at an initial resistance of about 200 k$\Omega$, $\alpha$ is about 0.03 when a TaCN electrode is used.

A physical vapor deposition (PVD), a chemical vapor deposition (CVD), a plasma enhanced chemical vapor deposition (PECVD), an atomic layer deposition (ALD), and a radical auxiliary atomic layer deposition (RAALD) may be applied as a method of forming the heat electrode 110. When a thermal CVD is used, resistance of a heat electrode may be increased. In this specification, thermal CVD is a term in comparison to PECVD and means a deposition method in which, without using plasma, chemical reaction using thermal energy at a relatively high temperature is utilized.

FIG. 4 is a flowchart illustrating a method of forming a metal nitride layer according to example embodiments.

In operation S10, a thermal CVD for forming TaN according to example embodiments may first increase a temperature in a reactor to between about 100° C. and about 550° C. This temperature range is for supplying thermal energy to cause reaction between reaction substances without applying plasma.

In operation S20, a gas including a first reaction material and a gas including a second material may react to form a metal nitride. In a reactor temperature range of about 100° C. to about 550° C., pressure may be low (less than about 10 Torr) and a flow rate of a reaction material may be between about 10 scan and about 1000 sccm.

The first reaction material may include a source material including metal, for example, Tantalum, and may use a reaction gas including tantalum halide derivatives or tantalum amine derivatives, for example. The tantalum halide derivatives may include $TaF_5$, $TaI_5$, $TaCl_5$, and $TaBr_5$ and the tantalum amine derivatives may include $Ta(NEt_2)$ or $Ta(NMe_2)_5$.

The second material and the first reaction material may react in order to deposit only a metal nitride component on a substrate. For example, elements having ligand coupling included in a chemically adsorbed reaction material may be removed from the reaction material through gas including $H_2$, $NH_3$, $SiH_4$, $Si_2H_6$ and a solid material layer including TaN may be formed.

In addition, in order to increase thermal stability and efficiency of a heat electrode, Group 14 elements, for example, C, Si, Ge, and Sn, may be added.

For example, if carbon is further included, operation S30 may be added such that a process for forming a layer that contains carbon in a metal nitride is performed. If CVD is performed through a metal organic chemical vapor deposition (MOCVD) using organic metal source, without carbon supply source reaction gas, carbon in the source itself for first reaction material supply and a metal nitride may be deposited at the same time. If organic metal source is not applied, source such as $C_2H_2$ may be supplied to add carbon. Besides that, source such as Bis(tertiary-butylamino)Silane (BTBAS) and $SiH_4$ may be supplied to add silicon elements and source such as GeMO and $GeH_4$ may be supplied to add germanium elements.

Operation S30 may be performed after the performing of operation S20 in FIG. 4 but example embodiments are not limited thereto. For example, operation S20 and operation 30 may be performed alternately or simultaneously.

When a heat electrode is formed only with a metal nitride without adding Group 14 elements, operation S30 may be omitted and the following operation S40 may be performed. In operation S40 as another stage of the thermal CVD, purge gas may be provided to remove remaining gas. In example embodiments, the purge gas may be provided after the reaction is completed. Furthermore, operation S40 may be provided as a final stage of the thermal CVD.

The heat electrode 110 may be formed thereby and may have resistivity of more than about 5000 $\mu\Omega$·cm so that it can work as the efficient heat electrode.

Moreover, although not illustrated in the drawings, the heat electrode 110 may be &Lined in hole of a mold layer, for example, an insulation layer such as an oxide layer or a nitride layer. That is, after the forming of the mold layer, the hole may be formed therein and then a process for forming the heat electrode 110 may be performed.

The heat electrode 110, as shown in the drawings, may be formed to have a horizontal section of a bar shape, a disk shape, a donut shape, or an arc shape. Example embodiments, however, are not limited to the aforementioned shapes Referring to FIG. 3B, a variable resistance material layer 120 may be formed on the heat electrode 110. Although not illustrated in the drawings, a buffer layer may be formed in order to improve interfacial property between the heat electrode 110 and the variable resistance material layer 120.

As an example of the variable resistance material layer 120, there is a phase change material whose phase changes into a crystalline state or an amorphous state according to a cooling rate after heating. The phase change material may be formed of a compound including at least one of chalcogenide based elements such as Te and Se and at least one of Ge, Sb, Bi, Pb, Sn, Ag, As, S, Si, P, O and N. As a more specific example, the phase change material may include Ge—Sb—Te, As—Sb—Te, As—Ge—Sb—Te, Sn—Sb—Te, Ag—In—Sb—Te, In—Sb—Te, Group 5A element—Sb—Te, Group 6A element—Sb—Te, Group 5A element—Sb—Se or Group 6A element-Sb—Se. The variable resistance material layer 120 may include a phase change material doped with carbon, nitride, silicon or oxygen. The variable resistance material layer 120 may be deposited through PVD or CVD.

The variable resistance material layer 120 may be formed with at least one layer or more than two material layers having respectively different electrical properties. Moreover, the variable resistance material layer 120 may be partially or entirely formed in a hole pattern such as the heat electrode 110 or may be formed on the heat electrode 110 formed in a molding layer and then may be patterned.

As shown in FIG. 3C, a top electrode 130 may be formed on the variable resistance material layer 120. A barrier layer (not shown) may be additionally provided between the variable resistance material layer 120 and the top electrode 130 to prevent or retard material diffusion between the variable resistance material layer 120 and the top electrode 130. A metal conductive layer for forming the top electrode 130 may include at least one of Ti, TiSix, TiN, TiON, TiW, TiAlN, TiAlON, TiSiN, TiBN, W, $WSi_x$, WN, WON, WSiN, WBN, WCN, Ta, $TaSi_x$, TaN, TaON, TaAlN, TaSiN, TaCN, Mo, MoN, MoSiN, MoAlN, NbN, ZrSiN, ZrAlN, Ru, CoSi, NiSi, conductive carbon, Cu and a combination thereof. The barrier layer may include at least one of TiN, TiW, TiCN, TiAlN, TiSiC, TaN, TaSiN, WN, MoN and CN. The top electrode 130 may have a line s shape and may be used as a bit line.

Figure 5:
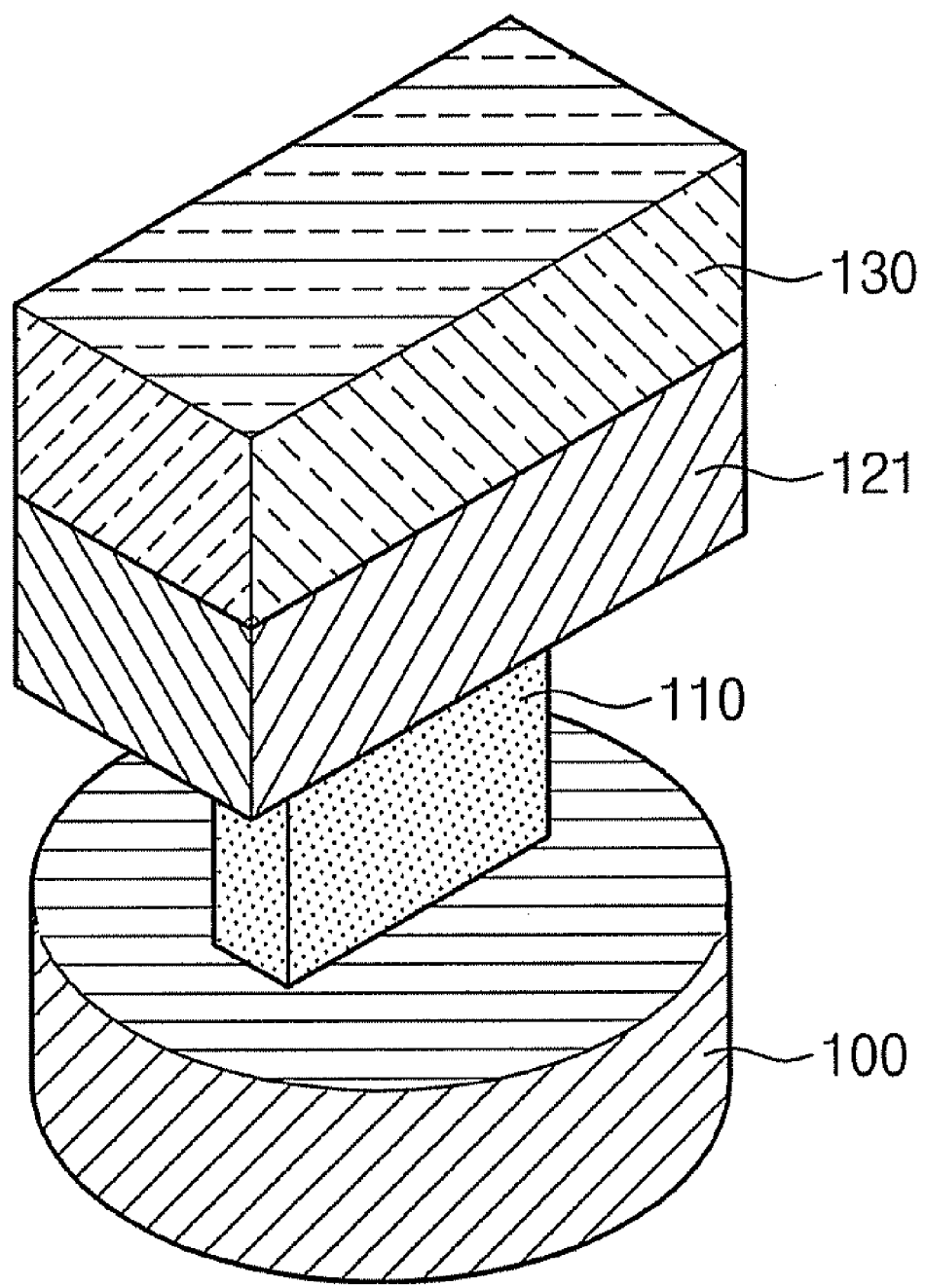
FIG. 5 is a view illustrating a variable resistance memory device according to example embodiments.

FIG. 5 is a view illustrating a variable resistance memory device according to example embodiments.

In order to further improve resistance drift of the variable resistance material layer 121, right after a variable resistance material layer is deposited or after a top electrode 130 is formed thereon, a hydrogen or a halogen element may be used for surface treatment such that it may be injected in a variable resistance material layer 121. The surface treatment using the hydrogen or the halogen element may be performed through a thermal treatment or plasma treatment method as described in detail in Korean Patent Application No. 10-2008-0085402 (U.S. patent application Ser. No. 12/487,292), the entire contents of which are hereby incorporated by reference.

If a heat electrode formed according to example embodiments and/or a hydrogen or halogen surface-processed variable resistance material layer are/is applied to a variable resistance memory device, resistance drift may be improved such that reliability may be enhanced when a resistance state of a multi-level is stored.

Figure 6:
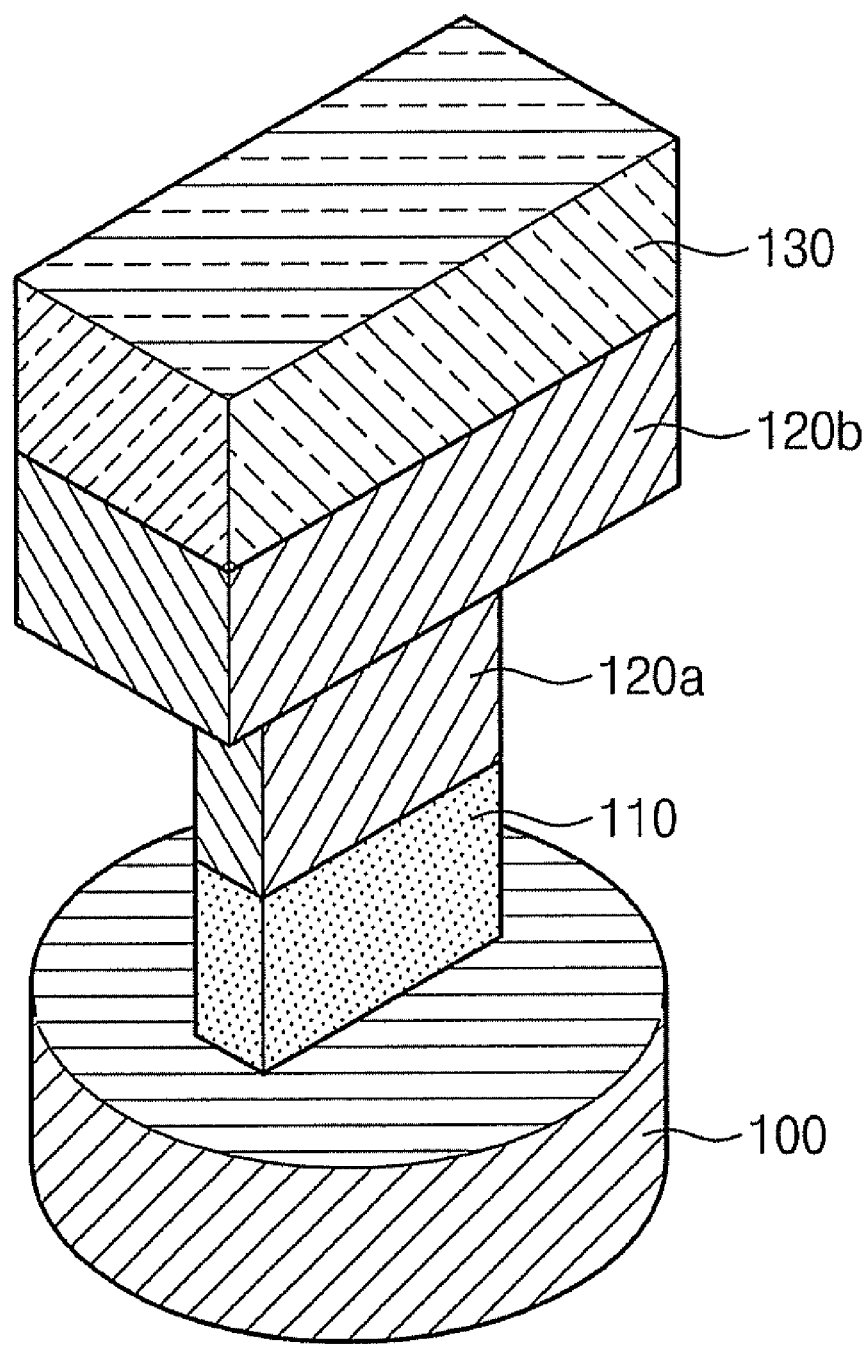
FIG. 6 is a view illustrating a multi-bit variable resistance memory device according to example embodiments.

FIG. 6 is a view illustrating a multi bit variable resistance memory device according to example embodiments.

A heat electrode 110 may be disposed on a semiconductor substrate 100 including a diode. The heat electrode 110 may be formed according to the method of forming a heat electrode as shown in FIG. 3A. That is, the heat electrode 110 may include a nitride of a metal whose atomic radius is greater than that of Ti and may be formed to have resistivity of more than about 5000 μΩ·cm.

A first phase change material layer 120a may be disposed on the heat electrode 110. The first phase change material layer 120a may be formed of a material having a relatively low resistance value (for example, SbTe) in an amorphous state. As shown in the drawing, the first phase change material layer 120a may be formed with a horizontal section like the heat electrode 110 therebelow. For example, an opening may be formed in a molding layer (not shown) and the heat electrode 110 and the first phase change material layer 120a may be formed in the opening.

A second phase change material layer 120b may be disposed on the first phase change material layer 120a.

The second phase change material layer 120b may be formed of a material (for example, GeSbTe doped with carbon) having a higher resistance value in an amorphous state than the first phase change material layer 120a. As shown in the drawing, the second phase change material layer 120b may be formed with a larger volume than the first phase change material layer 120a.

A top electrode 130 may be formed on the second phase change material layer 120b and as mentioned in example embodiments, a barrier layer (not shown) may be formed between the second phase change material layer 120b and the top electrode 130.

The variable resistance memory device of FIG. 6 may include the first phase change material layer 120a and the second phase change material layer 120b having respectively different sizes and components when data 00, 01, 10, and 11 are stored in a unit cell. Thus, when each state is programmed in a unit cell, data 00, 01, 10, and 11 may be programmed by applying respectively different sizes of pulses in a forward direction. This is described in detail in Korean Patent Application No. 10-2009-0073390, the entire contents of which are hereby incorporated by reference.

Figure 7:
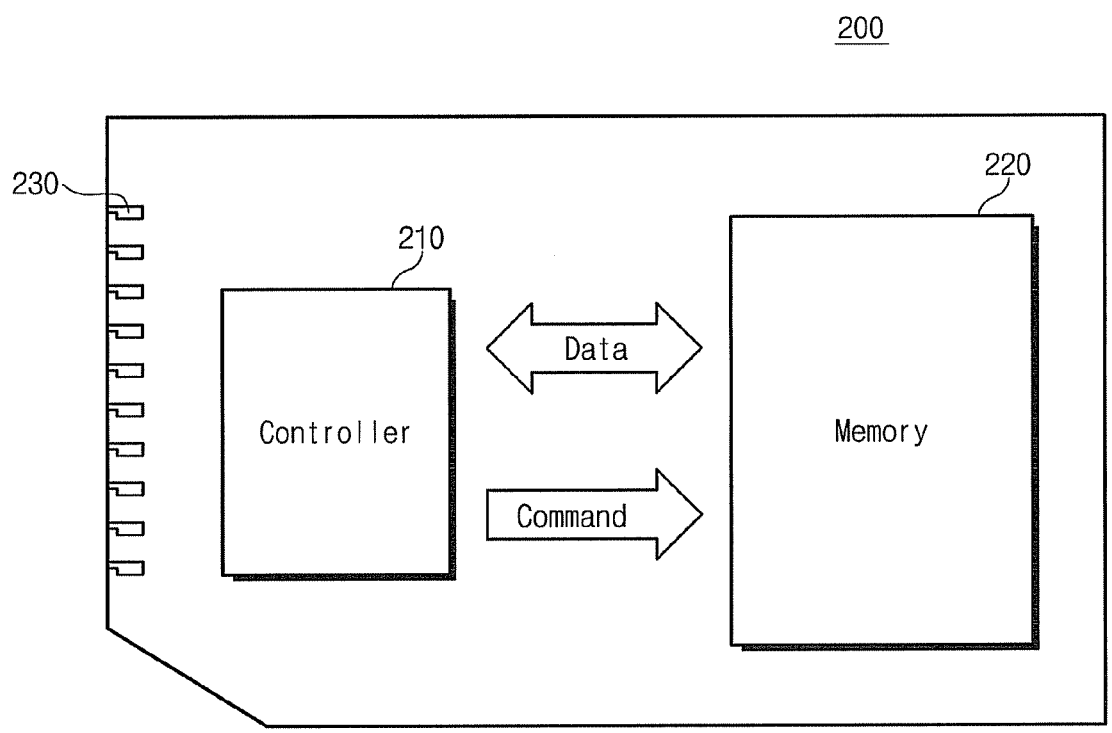
FIG. 7 is a block diagram illustrating a memory card system including phase change memory devices according to example embodiments.

Referring to FIG. 7, a memory card system 200 including variable resistance memory devices according to example embodiments will be described. The memory card system 200 may include a controller 210, a memory 220, and an interface 230. The controller 210 may include at least one microprocessor, digital signal processor, microcontroller or components similar thereto. The memory 220 may be used for storing commands executed by the controller 210 and/or user data. The memory 220 may include the variable resistance memory devices described in example embodiments and also randomly accessible volatile memories and/or various kinds of memory devices. The controller 210 and the memory 220 may be configured to exchange commands and/or data. The interface 230 may be responsible for interfacing data input/output with the external. The memory card system 200 may be a multimedia card (MMC), a secure digital card (SD), or a portable data storage device.

Figure 8:
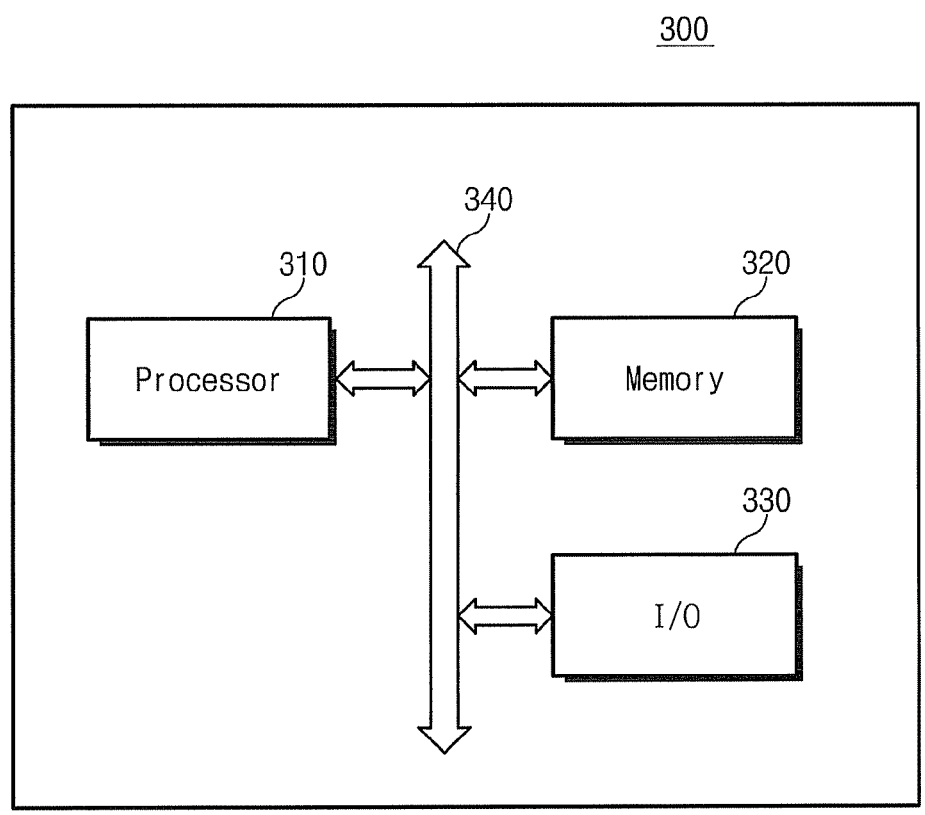
FIG. 8 is a block diagram illustrating an electronic device including phase change memory devices according to example embodiments.

Referring to FIG. 8, an electronic device 300 including variable resistance memory devices according to example embodiments will be described. The electronic device 300 includes a processor 310, a memory 320, and an input/output (I/O) 330. The processor 310, the memory 320, and the I/O 330 may be connected to each other through a bus 340. In example embodiments, the processor 310 may serve as a controller. The memory 320 may receive control signals such as RAS*, WE*, and CAS* from the processor 310. The memory 320 may be used for storing data accessed via the bus 340 and/or commands executed by the processor 310. The memory 320 may include variable resistance memory devices described in example embodiments. In order for specific realizations and modifications of the inventive concept, it is apparent to those skilled in the art that additional circuits and control signals may be further provided.

The electronic device 300 may be used for a computer system and a radio communication device such as a personal digital assistant (PDA), a laptop computer, a portable computer, a web tablet, a wireless phone, a mobile phone, a digital music player, an MP3 player, a navigation, a solid state disk (SSD), household appliance, or all devices for transmitting and receiving information in a wireless environment.

According to example embodiments, an interfacial property between a heat electrode and a variable resistance material layer can be improved and deterioration of electrical/physical characteristics due to stress during a high temperature process can be reduced. When a phase change layer is used as a variable resistance material layer, resistance drift of the phase change layer can be suppressed or minimized.

According to example embodiments, data stored in a variable resistance memory device may be stably maintained and read errors may be reduced.

The above-disclosed subject matter is to be considered illustrative and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. A method of forming a variable resistance memory device, comprising:
   forming a heat electrode;
   forming a variable resistance material layer on the heat electrode;
   performing one of a thermal treatment operation and a plasma treatment operation, with a halogen element, on the variable resistance material later; and
   forming a top electrode on the variable resistance material layer,
   wherein the heat electrode includes a nitride of a metal whose atomic radius is greater than that of titanium (Ti) and is formed through a thermal chemical vapor deposition (CVD) method without using plasma and the heat electrode is formed to have a resistivity of more than about 5000 $\mu\Omega\cdot$cm.

2. The method of claim 1, wherein the metal of the heat electrode has an ionic radius between about 68 pm and about 108 pm.

3. The method of claim 1, wherein the nitride of the metal includes one of tantalum (Ta), zirconium (Zr), dysprosium (Dy), and niobium (Nb).

4. The method of claim 3, wherein the nitride of the metal further includes carbon (C).

5. The method of claim 4, wherein the nitride of the metal includes a tantalum carbon nitride (TaCN).

6. The method of claim 1, wherein the thermal CVD method uses a first reaction gas and a second gas, the first reaction gas including at least one of tantalum halide derivatives and tantalum amine derivatives, the second gas including at least one of $H_2$, $NH_3$, $SiH_4$, and $Si_2H_6$.

7. The method of claim 6, wherein the thermal CVD method implements reaction of the first reaction gas and the second gas at a temperature of about 100° C. to about 550° C.

8. The method of claim 1, wherein the variable resistance material layer includes a chalcogenide based phase change material.

9. The method of claim 1, wherein forming the variable resistance material layer includes forming a first phase change material having a first volume on the heat electrode and forming a second phase change material having a second volume on the first phase change material.

10. The method of claim 9, wherein the second volume is larger than the first volume.

11. The method of claim 10, wherein the first phase change material is different from the second phase change material.

12. The method of claim 1, wherein the heat electrode is formed to have a resistivity of less than about 100000 $\mu\Omega\cdot$cm.

13. The method of claim 1, wherein the thermal chemical deposition (CVD) method without using plasma includes,
   reacting a first material and a second material to deposit only the nitride of a metal on a substrate, and
   reacting $C_2H_2$ with the nitride of a metal.

14. A method of forming a variable resistance memory device comprising:
   forming a heat electrode;
   forming a variable resistance material layer on the heat electrode; and
   forming a top electrode on the variable resistance material layer, and
   performing one of a thermal treatment operation and a plasma treatment operation, with a halogen element, on the variable resistance material later,
   wherein the heat electrode includes a nitride of a metal whose atomic radius is greater than that of titanium (Ti) and has a resistivity of more than about 5000 $\mu\Omega\cdot$cm.

15. The method of claim 14, wherein the variable resistance material layer is configured to store a resistance state of at least 2 bits with respect to a unit cell.

16. The method of claim 15, wherein the variable resistance material layer includes at least two phase change material layers having different resistance values in an amorphous state.

17. The method of claim 14, wherein the variable resistance material layer is configured to store a resistance state of more than 2 bits with respect to a unit cell.

18. The method of claim 17, wherein the variable resistance material layer includes more than two phase change material layers having different resistance values in an amorphous state.

19. The method of claim 18, wherein the different more than two phase change material layers have different volumes.

20. The method of claim 19, wherein:
   one phase change material layer of the different more than two phase change material layers contacts the heat electrode; and
   the one phase change material layer contacting the heat electrode has a less resistance value in an amorphous state than other phase change material layers in the variable resistance material layer.

21. The method of claim 14, wherein the heat electrode is formed to have a resistivity of less than about 100000 $\mu\Omega\cdot$cm.

* * * * *